US008735972B2

(12) United States Patent
Anderson et al.

(10) Patent No.: US 8,735,972 B2
(45) Date of Patent: May 27, 2014

(54) SRAM CELL HAVING RECESSED STORAGE NODE CONNECTIONS AND METHOD OF FABRICATING SAME

(75) Inventors: Brent A. Anderson, Jericho, VT (US); Edward J. Nowak, Essex Junction, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 13/227,554

(22) Filed: Sep. 8, 2011

(65) Prior Publication Data

US 2013/0062687 A1 Mar. 14, 2013

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 21/336* | (2006.01) |
| *G11C 11/00* | (2006.01) |

(52) U.S. Cl.
USPC .............. 257/330; 257/E21.41; 257/E29.262; 438/270; 365/154; 365/156

(58) Field of Classification Search
USPC ................... 257/E27.098–E27.101, E27.077, 257/E21.661, 330, 777, 903, E21.487, 257/E21.294, E21.41, E29.362; 365/154, 365/156; 438/270
See application file for complete search history.

(56) References Cited

U.S. PATENT DOCUMENTS

| | | | |
|---|---|---|---|
| 5,439,848 A | 8/1995 | Hsu et al. | |
| 5,554,870 A | 9/1996 | Fitch et al. | |
| 6,022,781 A | 2/2000 | Noble, Jr. et al. | |
| 6,541,351 B1 | 4/2003 | Bartlau et al. | |
| 6,677,649 B2 * | 1/2004 | Osada et al. | 257/379 |
| 7,176,125 B2 * | 2/2007 | Liaw | 438/637 |
| 7,405,131 B2 | 7/2008 | Chong et al. | |
| 7,439,153 B2 | 10/2008 | Tsuboi et al. | |
| 7,510,960 B2 * | 3/2009 | Toomey | 438/620 |
| 7,592,247 B2 * | 9/2009 | Yang et al. | 438/618 |
| 7,745,320 B2 | 6/2010 | Ye et al. | |
| 7,869,262 B2 * | 1/2011 | Huang | 365/154 |

(Continued)

OTHER PUBLICATIONS

Noda et al., A 2.9 um2 Embedded SRAM Cell with Co-Salicide Direct-Strap Technology for 0.18 um High Performance CMOS Logic, 0-7803-4100-7/97, 1997 IEEE, pp. 34.1.1-34.1.4.

*Primary Examiner* — David S Blum
(74) *Attorney, Agent, or Firm* — Schmeiser, Olsen & Watts; Michael LeStrange

(57) ABSTRACT

An SRAM cell and a method of forming an SRAM cell. The SRAM cell includes a first pass gate field effect transistor (FET) and a first pull-down FET sharing a first common source/drain (S/D) and a first pull-up FET having first and second S/Ds; a second pass gate FET and a second pull-down FET sharing a second common S/D and a second pull-up FET having first and second S/Ds; a first gate electrode common to the first pull-down FET and the first pull-up FET and physically and electrically contacting the first S/D of the first pull-up FET; a second gate electrode of the first pull-up FET; a third gate electrode common to the second pull-down FET and the second pull-up FET and physically and electrically contacting the first S/D of the second pull-up FET; and a fourth gate electrode of the first pull-up FET.

26 Claims, 10 Drawing Sheets

(56) References Cited

U.S. PATENT DOCUMENTS

| | | |
|---|---|---|
| 7,915,691 B2 * | 3/2011 | Wong et al. .................... 257/392 |
| 2002/0053700 A1 | 5/2002 | Ballantine et al. |
| 2006/0019488 A1 * | 1/2006 | Liaw ............................ 438/637 |
| 2006/0183289 A1 * | 8/2006 | Anderson et al. ............. 438/286 |
| 2007/0090428 A1 * | 4/2007 | Liaw ............................ 257/296 |
| 2008/0048297 A1 * | 2/2008 | Yang et al. .................... 257/586 |
| 2008/0135942 A1 * | 6/2008 | Minagawa .................... 257/368 |
| 2008/0179676 A1 * | 7/2008 | Hirano et al. ................. 257/350 |
| 2008/0239792 A1 * | 10/2008 | Wann et al. ................... 365/154 |
| 2008/0251934 A1 * | 10/2008 | Mandelman et al. .......... 257/777 |
| 2008/0272406 A1 | 11/2008 | Banna |
| 2009/0014796 A1 * | 1/2009 | Liaw ............................ 257/347 |
| 2009/0014806 A1 * | 1/2009 | Ostermayr et al. ........... 257/369 |
| 2009/0108374 A1 * | 4/2009 | Wong et al. ................... 257/392 |
| 2009/0159975 A1 * | 6/2009 | Chang .......................... 257/366 |
| 2009/0236685 A1 * | 9/2009 | Yang et al. .................... 257/520 |
| 2009/0309141 A1 * | 12/2009 | Okuno .......................... 257/288 |
| 2010/0093145 A1 * | 4/2010 | Tsuboi et al. ................. 438/275 |
| 2010/0301422 A1 * | 12/2010 | Osada et al. .................. 257/369 |
| 2011/0068413 A1 * | 3/2011 | Liaw ............................ 257/393 |
| 2012/0261726 A1 * | 10/2012 | Yang et al. .................... 257/288 |

* cited by examiner

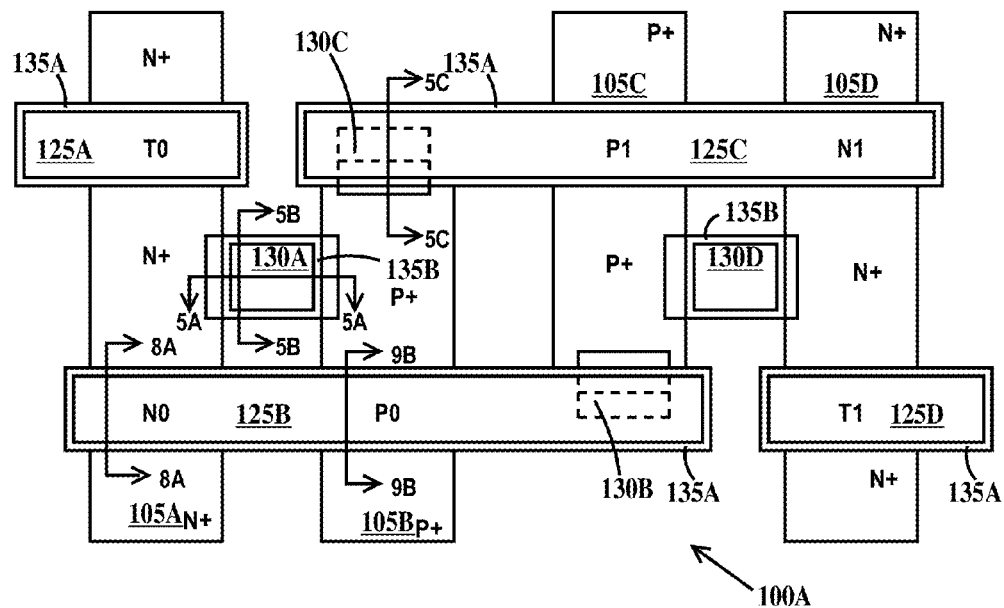
FIG. 5
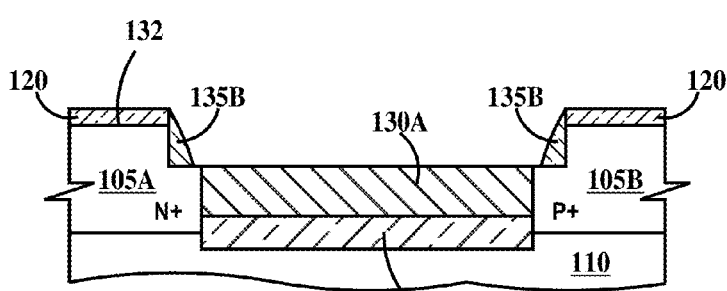
FIG. 5A
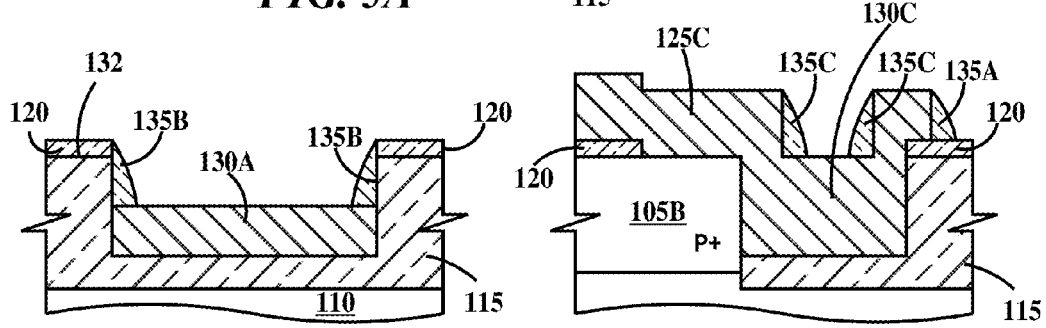
FIG. 5B
FIG. 5C

US 8,735,972 B2

SRAM CELL HAVING RECESSED STORAGE NODE CONNECTIONS AND METHOD OF FABRICATING SAME

FIELD OF THE INVENTION

The present invention relates to the field of semiconductor devices; more specifically, it relates to SRAM cells having recessed storage node connections and methods of fabricating SRAM cells having recessed storage node connections.

BACKGROUND

As the dimensions of field effect transistors (FETs) decrease, lithographic constraints are tending toward the gates of the FETs to be orientated in a single direction on a fixed pitch. When SRAM (static random access memory) cells are fabricated using these gate lithographic constraints it is becoming more difficult to fabricate storage node connections using the metal contact level. Accordingly, there exists a need in the art to mitigate the deficiencies and limitations described hereinabove.

SUMMARY

A first aspect of the present invention is a static random access memory (SRAM) cell comprising: a first pass gate field effect transistor (FET) and a first pull-down FET sharing a first common source/drain (S/D) and a first pull-up FET having first and second S/Ds; a second pass gate FET and a second pull-down FET sharing a second common S/D and a second pull-up FET having first and second S/Ds; a first gate electrode common to the first pull-down FET and the first pull-up FET and physically and electrically contacting the first S/D of the first pull-up FET; a second gate electrode of the first pull-up FET; a third gate electrode common to the second pull-down FET and the second pull-up FET and physically and electrically contacting the first S/D of the second pull-up FET; and a fourth gate electrode of the first pull-up FET.

A second aspect of the present invention is a method of forming a static random access memory (SRAM) cell, comprising: forming a first pass gate field effect transistor (FET) and a first pull-down FET sharing a first common source/drain (S/D) and a first pull-up FET having first and second S/Ds; forming a second pass gate FET and a second pull-down FET sharing a second common S/D and a second pull-up FET having first and second S/Ds; forming a first gate electrode common to said first pull-down FET and said first pull-up FET and physically and electrically contacting said first S/D of said first pull-up FET; forming a second gate electrode of said first pull-up FET; a third gate electrode common to said second pull-down FET and said second pull-up FET and physically and electrically contacting said first S/D of said second pull-up FET; and forming a fourth gate electrode of said first pull-up FET.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

FIGS. 2 through 7 illustrate methods of fabricating a gate-to-gate strap according to embodiments of the present invention;

DETAILED DESCRIPTION

The embodiments of the present invention provide SRAM cells having recessed storage node straps that are formed from gate electrode material (not contact level or metal wire level material) and formed during the gate electrode fabrication steps, thereby eliminating the need for complex contact shapes and processes currently used.

A photolithographic process is defined as a process in which a photoresist layer is applied to a surface of a substrate, the photoresist layer exposed to actinic radiation through a patterned photomask and the exposed photoresist layer developed to form a patterned photoresist layer. When the photoresist layer comprises positive photoresist, the developer dissolves the regions of the photoresist exposed to the actinic radiation and does not dissolve the regions where the patterned photomask blocked (or greatly attenuated the intensity of the radiation) from impinging on the photoresist layer. When the photoresist layer comprises negative photoresist, the developer does not dissolve the regions of the photoresist exposed to the actinic radiation and does dissolve the regions where the patterned photomask blocked (or greatly attenuated the intensity of the radiation) from impinging on the photoresist layer. After processing (e.g., an etch or an ion implantation), the patterned photoresist is removed. The photoresist layer may optionally be baked at one or more of the following steps: prior to exposure to actinic radiation, between exposure to actinic radiation and development, after development.

Figure 1:
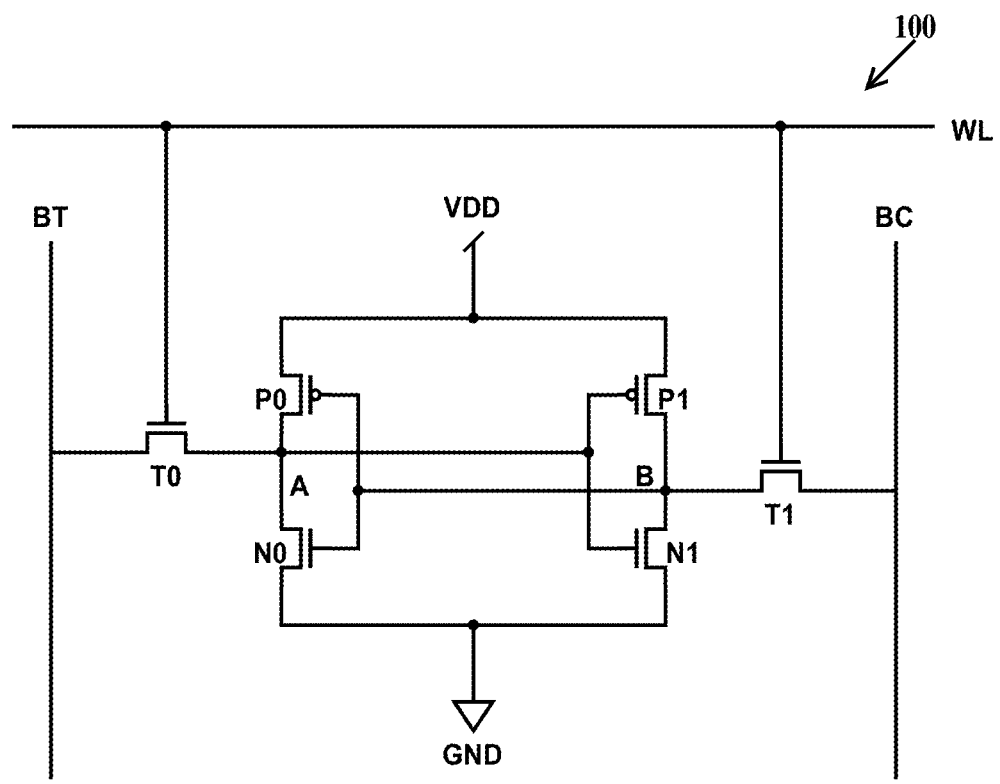
FIG. 1 is schematic diagram of an exemplary SRAM cell.

FIG. 1 is schematic diagram of an exemplary SRAM cell. In FIG. 1, an SRAM cell 100 comprises pass gate field effect transistors (FETs) T0 and T1 (which are illustrated as n-channel FETs (NFETs), NFETs N1 and N1 and p-channel FETs (PFETs) P0 and P1. The sources of PFETs P0 and P1 are connected to VDD and the drains of PFETs P0 and P1 to nodes A and B respectively. The sources of NFETs N0 and N1 are connected to GND and the drains of NFETs N0 and N1 to nodes A and B respectively. The gates of PFET P0 and NFET N0 are connected to node B and the gates of PFET P1 and NFET N1 are connected to node A. The drain of NFET T0 is connected to node A, the source of NFET T0 is connected to a bitline true (BT) line and the gate of NFET T0 is connected to a wordline WL. PFET P0 and NFET N0 form a first inverter and PFET P1 and NFET N1 form a second inverter. PFETS P0 and P1 are pull-up devices and NFETs N0 and N1 are pull-down devices in that they pull-up nodes A and B to VDD or pull-down nodes A and be to GND. The first and second inverters are cross-coupled. The drain of NFET T1 is connected to node B, the source of NFET T1 is connected to a bitline complement (BC) line and the gate of NFET T1 is connected to wordline WL. Alternatively, pass gate FETs T0 and T1 may be PFETs. The connection between FET T0 and node A and FET T1 and node B is made by first recessed straps according to embodiments of the present invention.

FIGS. 2 through 7 illustrate methods of fabricating a gate-to-gate strap according to embodiments of the present invention. In FIGS. 2-7 (and FIG. 10) labels T0, N0, P0, T1, N1 and P1 mark the channel regions of the six transistors of the SRAM cell 100 of FIG. 1. While only three cross-sections relative to FETS T0, N0, and P0 are illustrated in FIGS. 2-7 (and FIG. 10), similar respective cross-sections may be drawn relative to FETs T1, N1 an P1.

Figure 2:
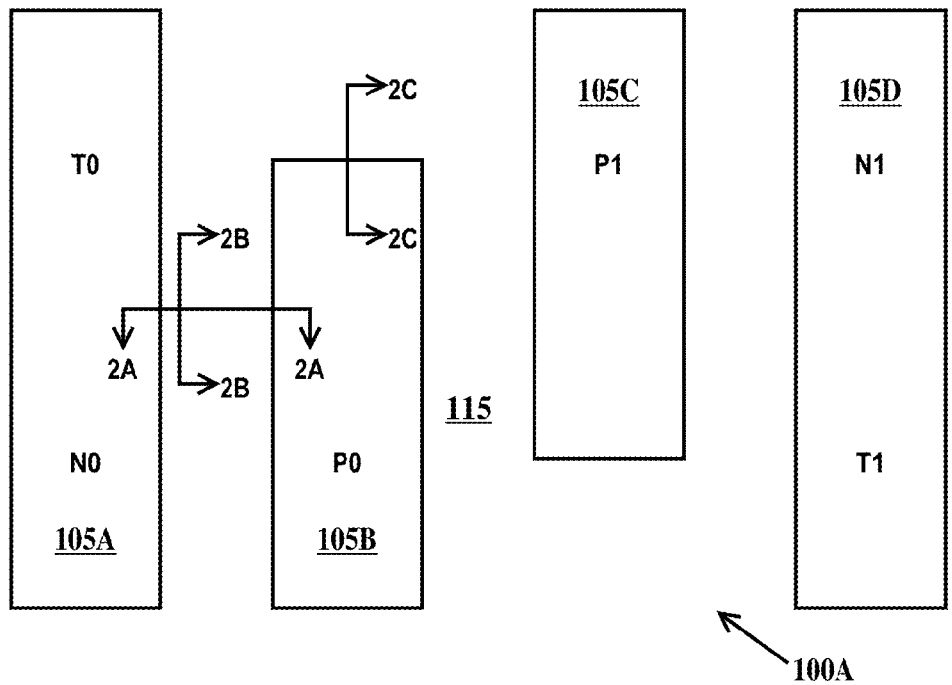
Figure 2A:
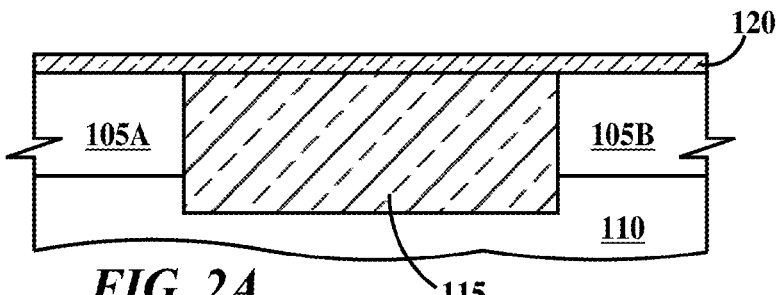
Figure 2B:
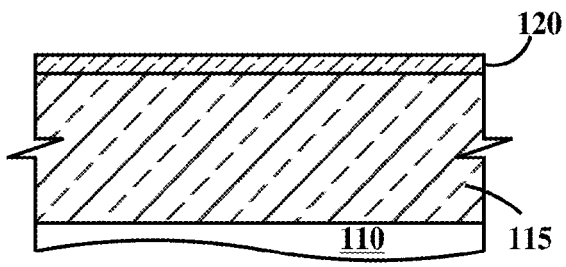
Figure 2C:
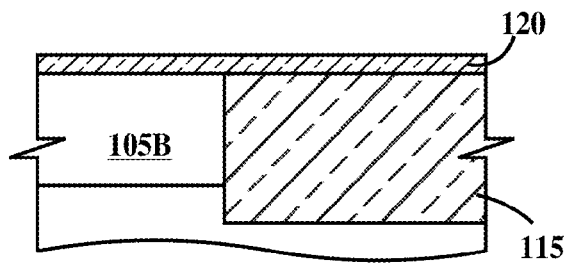

FIG. 2 is a plan view and FIGS. 2A, 2B and 2C are cross-sectional views through lines 2A-2A, 2B-2B and a portion of line 2C-2C respectively of FIG. 2. In FIGS. 2, 2A, 2B and 2C, P-type regions 105A and 105D and N-type regions 105B and 105C are formed in a semiconductor substrate 110 (e.g., a single crystal bulk silicon substrate as illustrated or a single crystal silicon layer of an silicon-on-insulator (SOI) substrate) 110. P-type regions 105A and 105D and N-type regions 105B and 105C are respectively P-type and N-type doped regions of substrate 110. Trench isolation 115 surrounds the P-type regions 105A and 105D and N-type regions 105B and 105C and a gate dielectric layer 120 is formed on P-type regions 105A and 105D and N-type regions 105B and 105C trench isolation 115. In one example, trench isolation 115 comprises silicon dioxide ($SiO_2$). In one example, gate dielectric layer 120 comprises $SiO_2$, silicon nitride ($Si_3N_4$) or combinations of layers thereof. In one example gate dielectric layer 120 is a high-K (dielectric constant) material, examples of which include but are not limited to metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$ or combinations of layers thereof. A high-K dielectric material has a relative permittivity above about 10. In one example, gate dielectric layer 120 is about 0.5 nm to about 20 nm thick.

Figure 3:
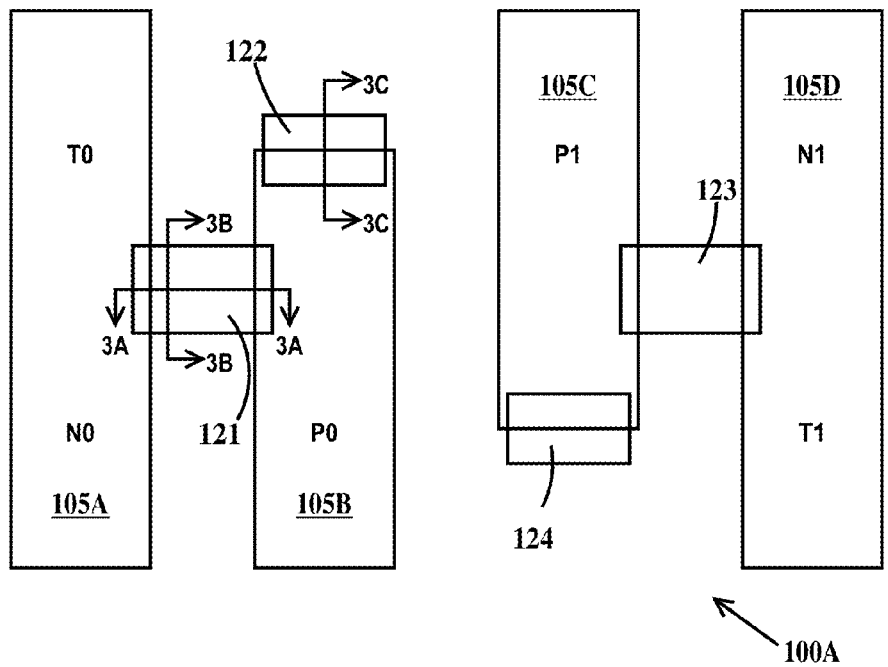
Figure 3A:
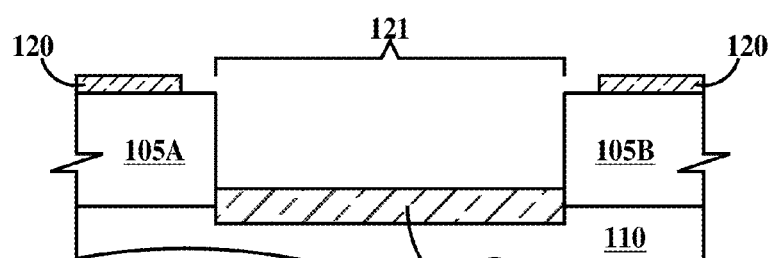
Figure 3B:
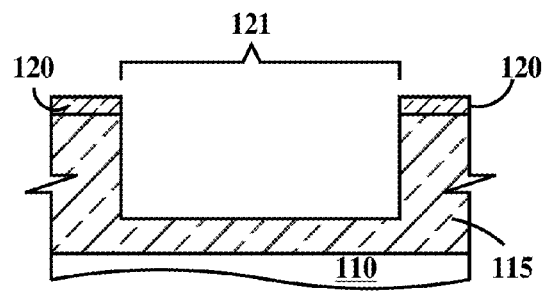
Figure 3C:
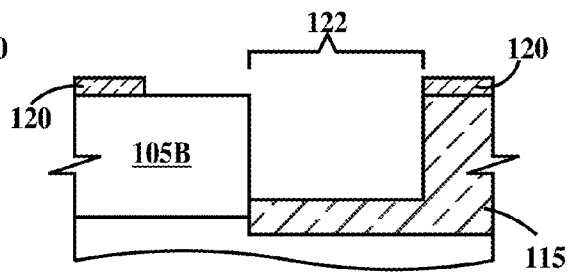

FIG. 3 is a plan view and FIGS. 3A, 3B and 3C are cross-sectional views through lines 3A-3A, 3B-3B and a portion of line 3C-3C respectively of FIG. 3. In FIGS. 3, 3A, 3B and 3C, trenches 121, 122, 123 and 124 are formed in trench isolation using a photolithographic process as defined supra. As illustrated in FIGS. 3, 3A, 3B and 3C, a reactive ion etch (RIE) has removed regions of gate dielectric layer 120 and etched trenches 121, 122, 123 and 124 into trench isolation 115. In one example, trenches 121, 122, 123 and 124 are etched using a RIE etch selective to substrate 110 (e.g., silicon) over trench isolation 115 (e.g., silicon oxide). Trenches 121, 122, 123 and 124 do not extend all the way through trench isolation 115.

Figure 4:
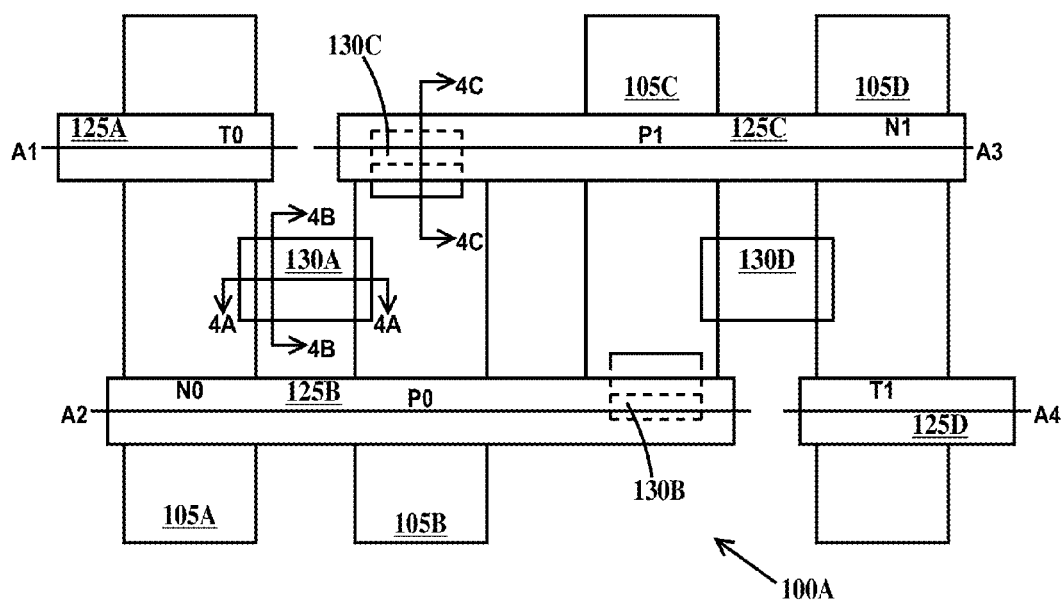
Figure 4A:
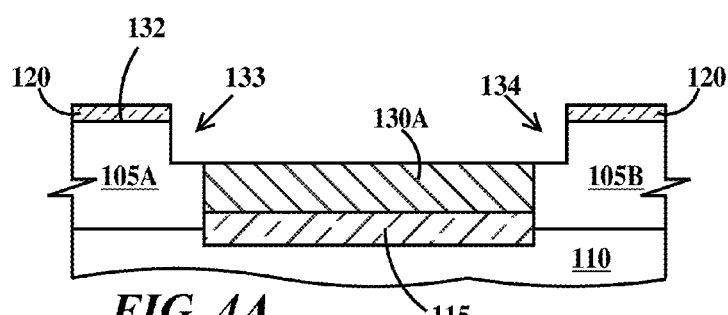
Figure 4B:
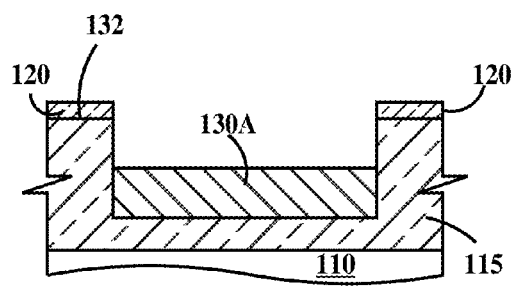
Figure 4C:
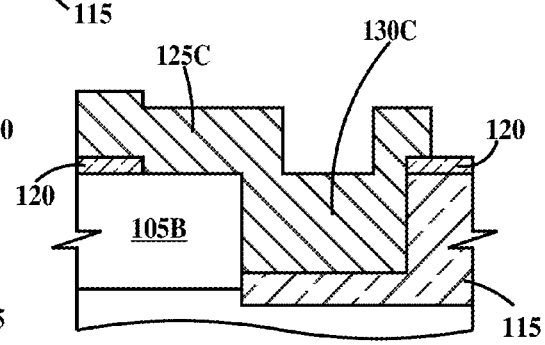

FIG. 4 is a plan view and FIGS. 4A, 4B and 4C are cross-sectional views through lines 4A-4A, 4B-4B and a portion of line 4C-4C respectively of FIG. 4. In FIGS. 4, 4A, 4B and 4C, gate electrodes 125A, 125B, 125C and 125D have been formed using a photolithographic process to define the horizontal (parallel to the top surface of substrate 110) extents of the gate electrodes 125A, 125B, 125C and 125D, followed by an etch (e.g., using an RIE process) to form gate electrodes 125A, 125B and 125C and 125D and straps 130A, 130B, 130C and 130D. Strap 130C is a buried portion of gate electrode 125C formed in trench 122 (see FIGS. 3 and 3C). Strap 130B is a buried portion of gate electrode 125B formed in a corresponding trench abutting N-type region 105C. Strap 130A is formed entirely within trench 121 (see FIGS. 3, 3A and 3B). Note the RIE process used to etch gate electrodes 125A, 125B, 125C and 125D have recessed strap 130A below the top surface 132 of trench isolation 115 and etched notches 133 and 134 into P-type region 105A and N-type region 105B respectively (e.g., when substrate 110 is silicon and the gate electrodes are polysilicon). Strap 130D is similar to strap 130A.

Straps 130A and 130D were defined by the photomask used to etch trenches 121, 122, 123 and 124 (see FIGS. 2, 2A, 2B and 2C). Straps 130A and 130B are not defined by the photomask used to define gate electrodes 125A, 125B, 125C and 125D. Straps 130A and 130B are formed from the gate electrode layer that was not protected by the photoresist during the gate electrode RIE process and are a residual layer of that gate electrode layer that was not removed from trenches 121 and 123 (see FIGS. 3, 3A and 3B) during the RIE process. The gate electrode RIE stopped on gate dielectric layer 120.

The major axis A1 of gate electrode 125A, the major axis A2 of gate electrode 125B, the major axis A3 of gate electrode 125C, and the major axis A4 of gate electrode 125D are all aligned in the same direction (i.e., are mutually parallel).

While the illustrated embodiment shows both straps 130A and 130D and straps 130C and 130D, alternative embodiments include forming straps 130A and 130D but not 130B and 130C and forming straps 130B and 130C but not straps 130A and 130D.

FIG. 5 is a plan view and FIGS. 5A, 5B and 5C are cross-sectional views through lines 5A-5A, 5B-5B and a portion of line 5C-5C respectively of FIG. 5. In FIGS. 5, 5A, 5B and 5C, dielectric sidewall spacers 135A are formed on the sidewalls of gate electrodes 125A, 125B, 125C and 125D. Sidewall spacers 135B are also formed on exposed sidewalls of P-type region 105A (and 105D) and N-type region 105D (and 105C) the sidewalls of trench 140. Sidewall spacers 135C may also be formed on internal sidewalls of gate electrode 125C (and 125B) over strap 130C (and 130B). Formation or non-formation of sidewall spacers 135C depends upon the exact geometry and dimensions of the actual structure. In one example, sidewall spacers 135A, 135B and 135C comprise $Si_3N_4$. Sidewall spacers 135A, 135B and 135C may be formed simultaneously by a blanket deposition of a conformal dielectric layer (e.g. $Si_3N_4$) followed by an RIE to remove the dielectric material from horizontal surfaces (surfaces parallel to the top surface of substrate 110).

Figure 8A:
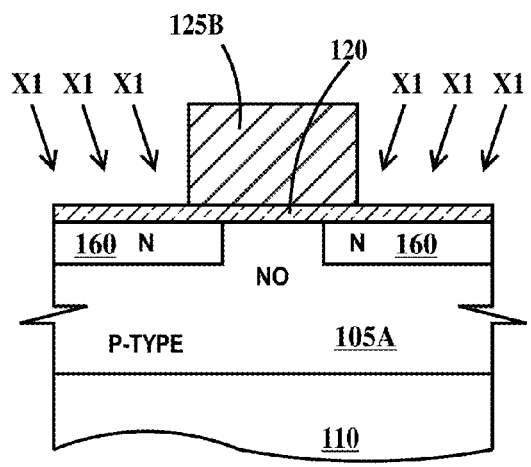
FIGS. 8 and 9 illustrate detailed steps in the formation of NFETs and PFETs of SRAM cells according to embodiments of the present invention.
Figure 8B:
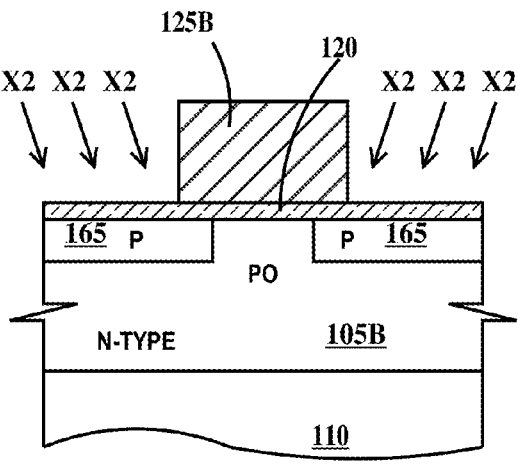
Figure 9A:
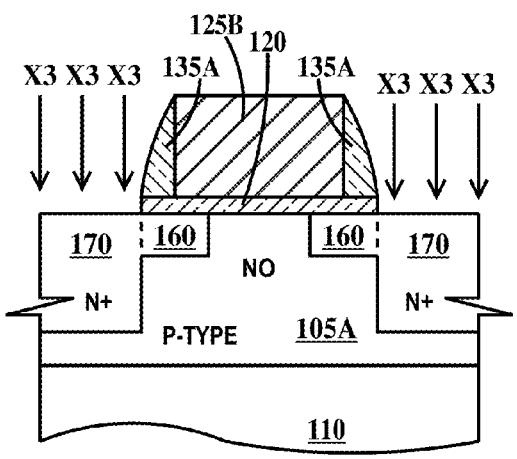
Figure 9B:
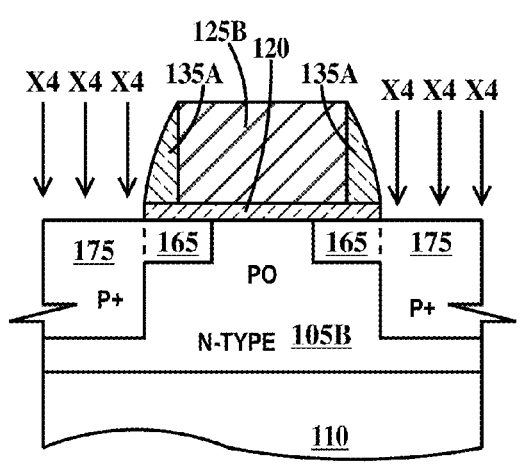

Prior to sidewall spacer formation, optional source/drain (S/D) extensions may be formed by ion implantation as illustrated in FIGS. 8A and 8B and described infra. After sidewall spacer formation, S/Ds may be formed by ion implantation as illustrated in FIGS. 9A and 9B and described infra. In FIGS. 5, 5A, 5B and 5C, the label N+ indicates the S/D of an NFET and the label P+ indicates the S/D of a PFET. S/D extensions are not illustrated in FIGS. 5, 5A, 5B and 5C.

Figure 6:
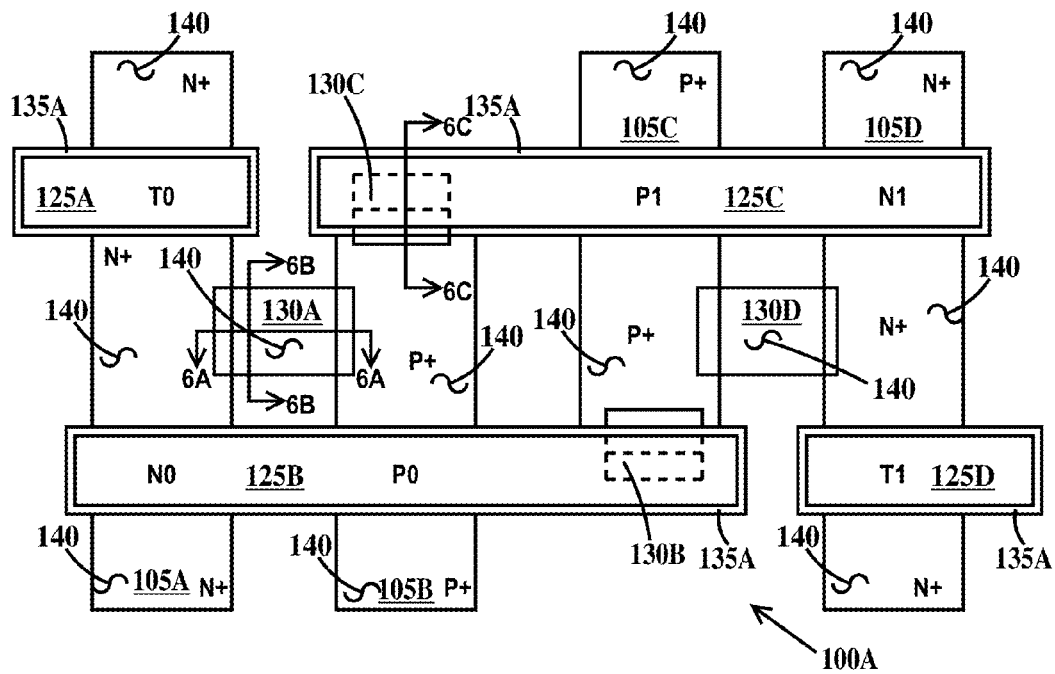
Figure 6A:
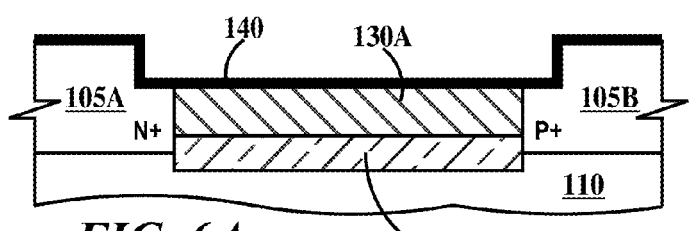
Figure 6B:
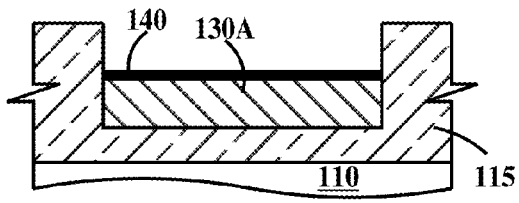
Figure 6C:
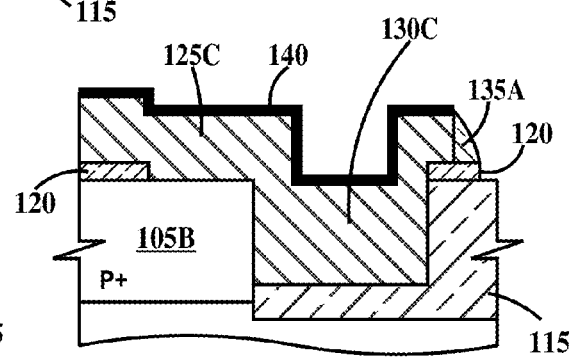

FIG. 6 is a plan view and FIGS. 6A, 6B and 6C are cross-sectional views through lines 6A-6A, 6B-6B and a portion of line 6C-6C respectively of FIG. 6. In FIGS. 6, 6A, 6B and 6C, sidewall spacers 135B and 135C (see FIGS. 5, 5A, 5B and 5C) are removed using a photolithographic/etch process. Sidewall spacers 135A are not removed. For an alternative where sidewall spacers 135B and 135C are not removed, see FIGS. 10, 10A, 10B and 10C. Also any exposed gate dielectric 120 not protected by sidewall spacers 135A or gate electrodes 125A, 125B, 125C and 125D is removed and optional metal silicide layers 140 formed on exposed surfaces S/Ds formed in P-type regions 105A and 105D, N-type regions 105B and 105C and straps 130A and 130D. Metal silicide layers 140 may be formed by blanket depositing a thin metal layer, followed by high temperature heating in an inert or reducing atmosphere at a temperature that will cause the metal to react with silicon, and followed by an etch to remove un-reacted metal.

Figure 7:
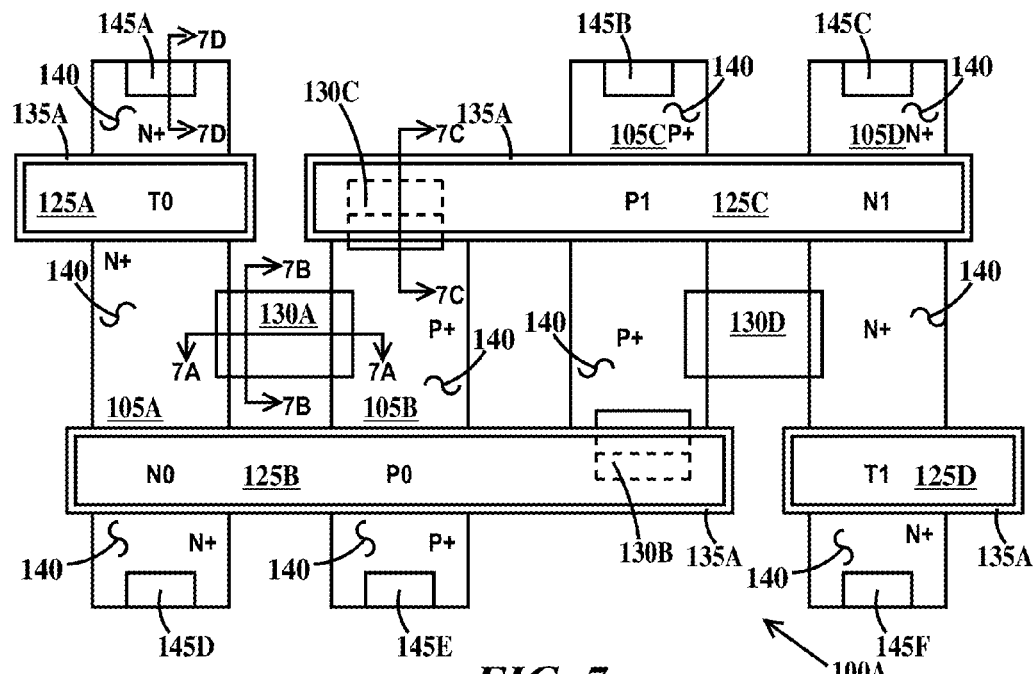
Figure 7B:
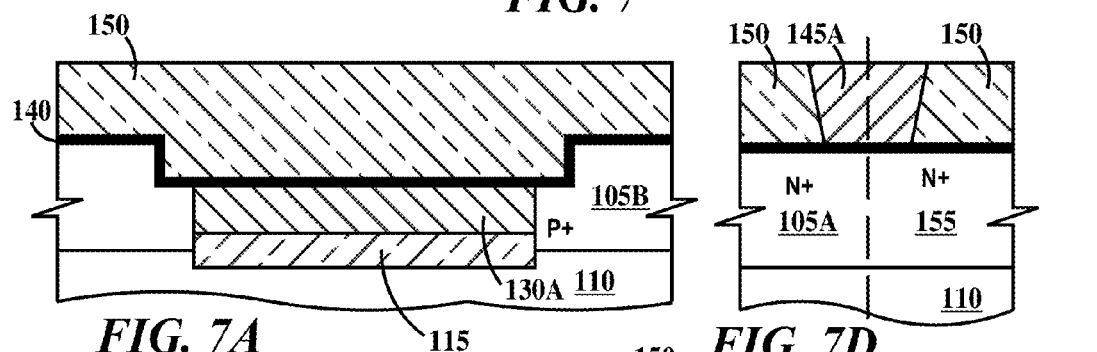
Figure 7B:
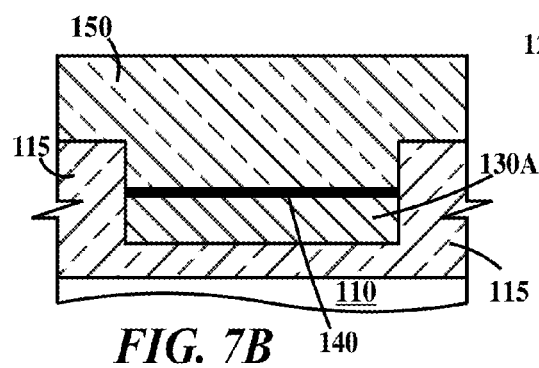
Figure 7C:
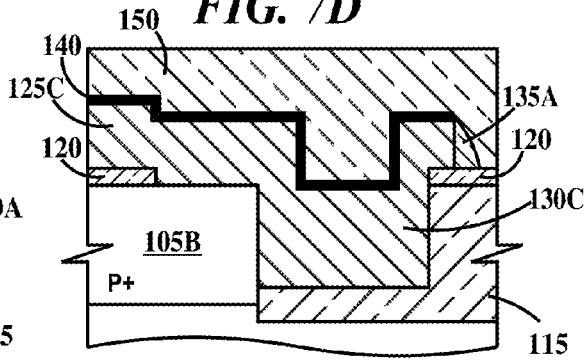

FIG. 7 is a plan view and FIGS. 7A, 7B and 7C are cross-sectional views through lines 7A-7A, 7B-7B and a portion of line 7C-7C respectively of FIG. 7. In FIGS. 7, 7A, 7B and 7C, electrically conductive contacts 145A, 145B, 145C, 145D, 145E and 145F are formed in a dielectric layer 150 that is formed on exposed surfaces of trench isolation 115, sidewall spacers 135A and metal silicide layer 140. Contact 145A is typical of contacts 145A, 145B, 145C, 145D, 145E and 145F. In FIG. 7D, contact 145A extends from the top surface of dielectric layer 150 to a top surface of metal silicide layer 140. The top surface of contact 145A is coplanar with the top surface of dielectric layer 150. Contact 145A is shared with an adjacent SRAM cell not illustrated in FIG. 7, but a portion of which is shown in FIG. 7D, so contact 145 also contacts a S/D 155 of an FET T0 of the adjacent SRAM cell. In one example, contacts 145A, 145B, 145C, 145D, 145E and 145F comprise tungsten. In one example, dielectric layer 150 comprises $SiO_2$.

Comparing FIG. 7 to FIG. 1, contact 145A connects to the bitline true (BT), contact 145F connects to the bitline complement (BC), contacts 145C and 145D connect to GND and contacts 145B and 145E connect to VDD. Transistors T0 and N0 share a common S/D and FETS N1 and T1 share a common S/D. Storage node A comprises the common S/D of FETS T0 and N0 which are connected to a S/D of FET P0 by strap 130A. Storage node A is connected to the gates of FETs P1 and N1 by strap 130C and gate electrode 130D. Storage node B comprises the common S/D of FETS T1 and N1 which are connected to a S/D of FET P1 by strap 130D. Storage node B is connected to the gates of FETs P0 and N0 by strap 130B and gate electrode 125C. Thus nodes A and B do not include any connection made at the contact level.

FIGS. 8 and 9 illustrate detailed steps in the formation of NFETs and PFETs of SRAM cells according to embodiments of the present invention. In FIG. 8A, prior to sidewall spacer formation, an angled extension ion implantation of species X1 (an N dopant) for NFET N0 where P-type region 105A is not protected by gate electrodes 125B to form S/D extension regions 160. In FIG. 8B, prior to sidewall spacer formation, an angled extension ion implantation of species X2 (a P dopant) for PFET P0 where N-type region 105B is not protected by gate electrodes 125B to form S/D extension regions 165. In FIG. 9A, after sidewall spacer formation, a S/Dion implantation of species X3 (an N dopant) for NFET N0 where P-type region 105A is not protected by gate electrodes 125B and spacers 135A to form S/D regions 170. In FIG. 9B, after sidewall spacer formation, a S/Dion implantation of species X4 (a P dopant) for PFET P0 where N-type region 105B is not protected by gate electrodes 125B and spacers 135A to form S/D regions 175.

Figure 10:
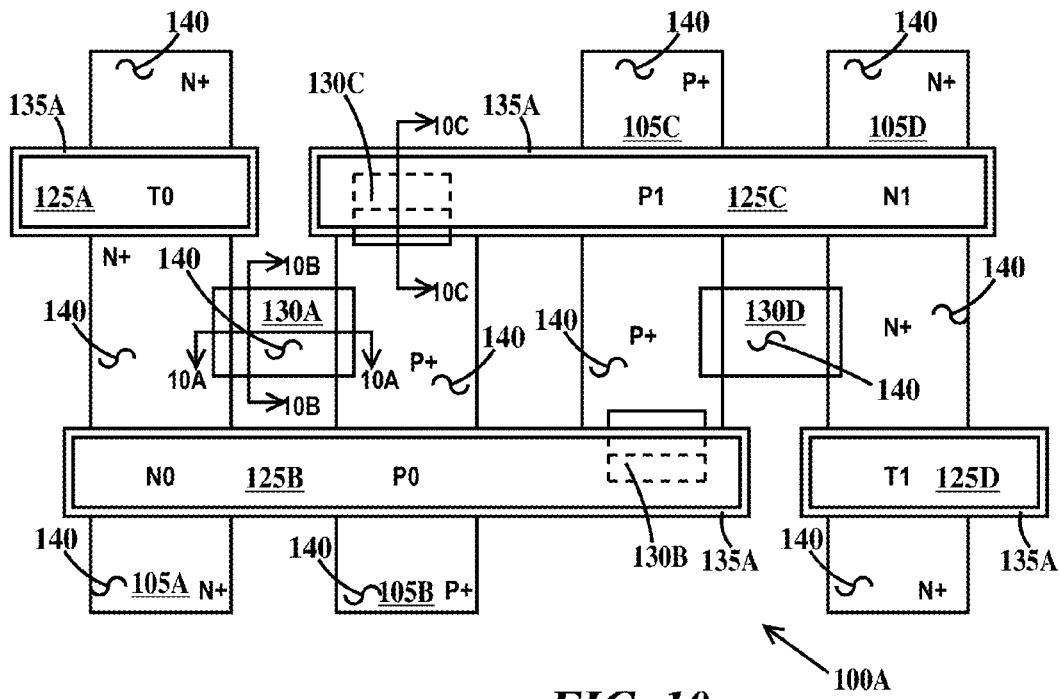
FIG. 10 illustrates an alternative strapping technique according to embodiments of the present invention.
Figure 10A:
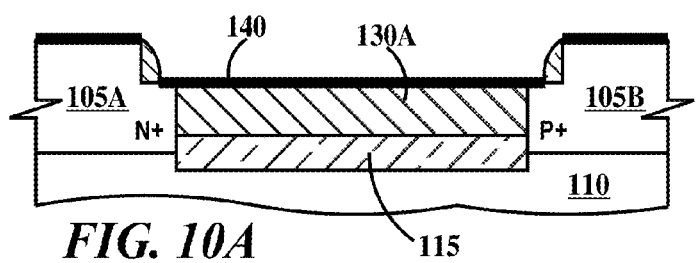
Figure 10B:
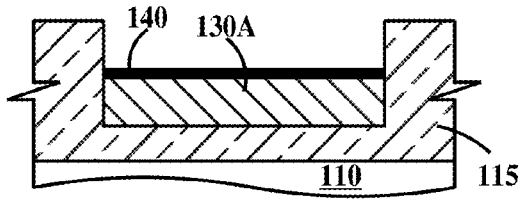
Figure 10C:
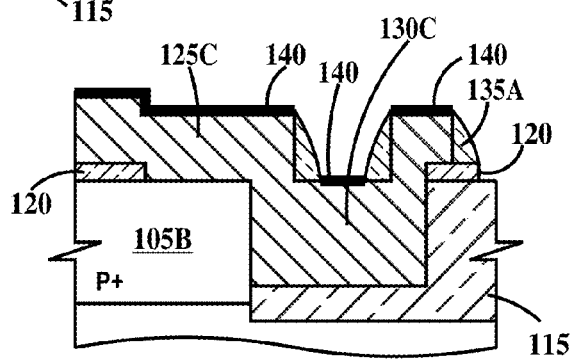

FIG. 10 illustrates an alternative strapping technique according to embodiments of the present invention. FIG. 10 is a plan view and FIGS. 10A, 10B and 10C are cross-sectional views through lines 10A-10A, 10B-10B and a portion of line 10C-10C respectively of FIG. 10. FIGS. 10, 10A, 10B and 120C are similar to respective FIGS. 6, 6a, 6B and 6C with the exception that metal silicide layer 140 is not formed on regions of P-type region 105A and N-type region 105B that are protected by sidewall spacers 135A or 135B.

Figure 11:
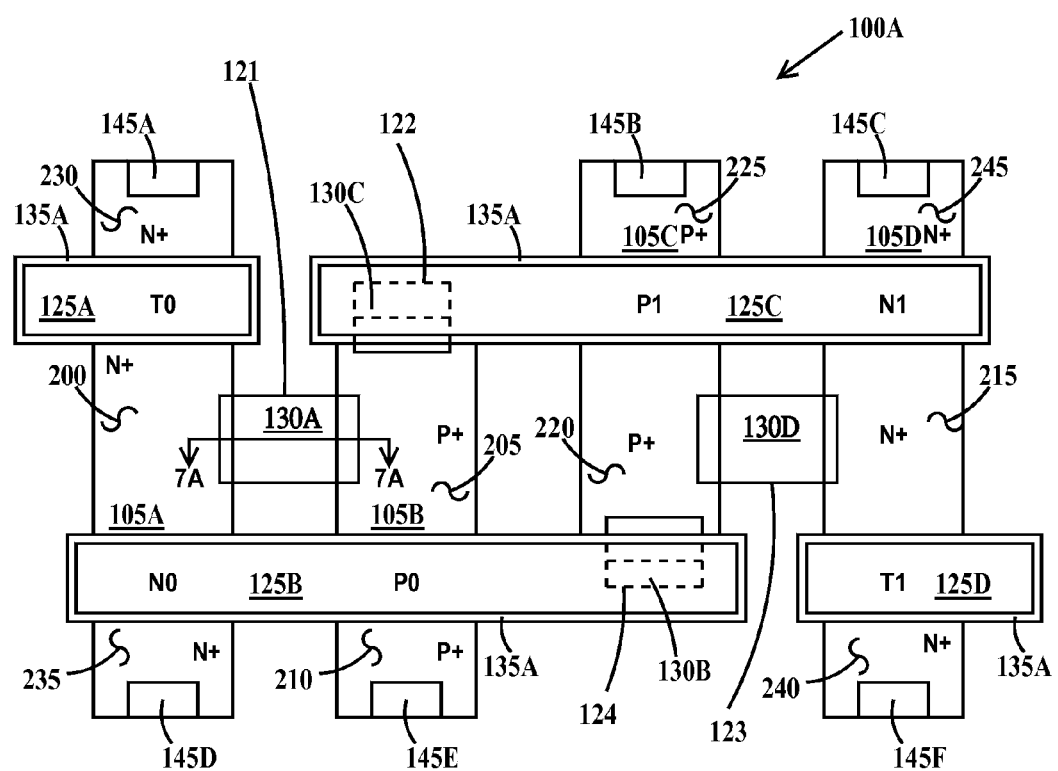
FIG. 11 illustrates a completed SRAM cell according to embodiments of the present invention.

FIG. 11 illustrates a completed SRAM cell according to embodiments of the present invention after the implantations of species X1, X2, X3 and X4 and silicide formation described supra. FIG. 11 is similar to FIG. 7 except the source/drains rather than the silicide regions 140 (see FIG. 7) are illustrated. In FIG. 11, A SRAM cell 100A includes a first pass gate FET T0 and a first pull-down FET N0 sharing a first common S/D 200, a first pull-up FET P0 having a first S/D 205 and a second S/D 210, a second pass gate FET T1 and a second pull-down FET N1 sharing a second common S/D 215, a second pull-up FET P1 having a first S/D 220 and second S/D 225, first gate electrode 125B is common to first pull-down FET N0 and first pull-up FET P0 and in physical and electrical contact with first S/D 220 of said second pull-up FET P1, second gate electrode 125A of first pass gate FET T0, third gate electrode 125C common to second pull-down FET N1 and second pull-up FET P1 and in physical and electrical contact with first S/D 205 of first pull-up FET P0, fourth gate electrode 125D of said second pass gate FET T1, a second S/D 230 of first pass gate FET T0, a second S/D 235 of first pull-down FET N0, a second S/D 240 of second pass gate T1, and a second S/D 245 of second pull-down FET N1. Strap 130A is partially formed in third trench 121, strap 130B is partially formed in fourth trench 124, strap 130C is partially formed in first trench 122, and strap 130D is partially formed in second trench 123.

Thus the embodiments of the present invention provide SRAM cells having recessed storage node straps and method of fabricating SRAM cells having recessed storage node straps that are formed from gate electrode material (not metal contact or metal wire material) and defined during the gate electrode fabrication steps.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A static random access memory (SRAM) cell, comprising:

a first pass gate field effect transistor (FET) and a first pull-down FET sharing a first common source/drain (S/D);

a first pull-up FET having first and second S/Ds;

a second pass gate FET and a second pull-down FET sharing a second common S/D;

a second pull-up FET having first and second S/Ds;

a first gate electrode common to said first pull-down FET and said first pull-up FET and physically and electrically contacting said first S/D of said second pull-up FET, said first S/D of said second pull-up FET having a first end adjacent to said first gate electrode and a opposite second end adjacent to a third gate electrode, said first gate electrode extending over and electrically and physically contacting an end wall of said first end of said first S/D of said second pull-up FET and extending over an adjacent top surface of said first end of said first S/D of said second pull-up FET;

a second gate electrode of said first pass gate FET;

said third gate electrode common to said second pull-down FET and said second pull-up FET and physically and electrically contacting said first S/D of said first pull-up FET, said first S/D of said first pull-up FET having a first end adjacent to said third gate electrode and a opposite second end adjacent to said first gate electrode, said third gate electrode extending over and electrically and physically contacting an end wall of said first end of said first S/D of said first pull-up FET and extending over an adjacent top surface of said first end of said first S/D of said first pull-up FET; and a fourth gate electrode of said second pass gate FET.

2. The SRAM cell of claim 1, wherein said first, second, third and fourth gate electrodes are unconnected regions of a same layer of a same material.

3. The SRAM cell of claim 1, including:
metal silicide layers on respective top surfaces of said first, second, third and fourth gate electrodes, said first, second, third and fourth gate electrodes comprising polysilicon.

4. The SRAM cell of claim 1, wherein:
first major axes of said first, second, third and fourth gate electrodes are parallel;
said first common S/D, a second S/D of said first pass gate FET and a second S/D of said first pull-down FET are located in a contiguous first region of a semiconductor substrate;
said first S/D and said second S/D of said first pull-up FET are located in a contiguous second region of said semiconductor substrate;
said first S/D and said second S/D of said second pull-up FET are located in a contiguous third region of said semiconductor substrate;
said second common S/D, a second S/D of said second pass gate FET and a second S/D of said second pull-down FET are located in a contiguous fourth region of said semiconductor substrate;
second major axes of said first, second, third and fourth regions are parallel; and
said first and second major axes are perpendicular.

5. The SRAM cell of claim 1, including:
dielectric trench isolation between first, second, third and fourth regions of a single crystal bulk silicon substrate or a single crystal layer of a silicon-on-insulator substrate, said first common S/D in said first region, said first and second S/Ds of said first pull-up FET in said second region, said second common S/D in said third region, said first and second S/Ds of said second pull-up FET in said fourth region;
a first trench in said dielectric trench isolation abutting said end wall of said first end of first S/D of said first pull-up FET, said third gate electrode at least partially filling said first trench and physically and electrically contacting said end wall of said first end and said adjacent top surface of said first S/D of said first pull-up FET; and
a second trench in said dielectric trench isolation abutting said end wall of said first end of first S/D of said second pull-up FET, said first gate electrode at least partially filling said second trench and physically and electrically contacting said end wall of said first end and said adjacent top surface of said first S/D of said second pull-up FET.

6. The SRAM cell of claim 5, including:
a second S/D of said first pass gate FET in said first region and on an opposite side of said second gate electrode from said first common S/D;
a second S/D of said first pull-down FET in said first region and on an opposite side of said first gate electrode from said first common S/D;
said second S/D of said first pull-up FET in said second region and on an opposite side of said first gate electrode from said first S/D of said first pull-up FET;
a second S/D of said second pass gate FET in said third region and on an opposite side of said fourth gate electrode from said second common S/D;
a second S/D of said second pull-down FET in said third region and on an opposite side of said third gate electrode from said second common S/D; and
said second S/D of said second pull-up FET in said fourth region and on an opposite side of said third gate electrode from said first S/D of said second pull-up FET.

7. The SRAM cell of claim 1, including:
a first buried strap between said first common S/D and said first S/D of said first pull-up FET, said first buried strap in direct physical and electrical contact with a sidewall of said first common S/D and a sidewall of said of said first S/D of said first pull-up FET; and
a second buried strap between said second common S/D and said first S/D of said second pull-up FET, said second buried strap in direct physical and electrical contact with a sidewall of said second common S/D and a sidewall of said of said first S/D of said second pull-up FET.

8. The SRAM cell of claim 7, wherein said first, second, third and fourth gate electrodes and said first buried strap and second buried strap are unconnected regions of a same layer of a same material.

9. The SRAM cell of claim 7, including:
metal silicide layers on respective top surfaces of said first, second, third and fourth gate electrodes and said first and second straps, said first, second, third and fourth gate electrodes and said first and second straps comprising polysilicon.

10. The SRAM cell of claim 7, wherein:
first major axes of said first, second, third and fourth gate electrodes and said first and second straps are parallel;
said first common S/D, said second S/D of said first pass gate FET and said S/D of said first pull-down FET are located in a contiguous first region of a semiconductor substrate;
said first S/D and said second S/D of said first pull-up FET are located in a contiguous second region of said semiconductor substrate;
said first S/D and said second S/D of said second pull-up FET are located in a contiguous third region of said semiconductor substrate;
said second common S/D, said second S/D of said second pass gate FET and said S/D of said second pull-down FET are located in a contiguous fourth region of said semiconductor substrate;
second major axes of said first, second, third and fourth regions are parallel; and
said first and second major axes are perpendicular.

11. The SRAM cell of claim 1, including:
trench isolation between first, second, third and fourth regions of a semiconductor substrate;
said first common S/D, a second S/D of said first pass gate FET and a second S/D of said first pull-down FET in said first region of said semiconductor substrate, said first S/D and said second S/D of said first pull-up FET in said second region of said semiconductor substrate, said first S/D and said second S/D of said second pull-up FET in said third region of said semiconductor substrate, and said second common S/D, a second S/D of said second pass gate FET and a second S/D of said second pull-down FET are located in said fourth region of said semiconductor substrate;
a first trench in said trench isolation abutting said sidewall of said first end of first S/D of said first pull-up FET, said third gate electrode at least partially filling said first trench and physically and electrically contacting said sidewall of said first end and said adjacent top surface of said first S/D of said first pull-up FET;
a second trench in said trench isolation abutting said sidewall of said first end of first S/D of said second pull-up FET, said first gate electrode at least partially filling said second trench and physically and electrically contacting said sidewall of said first end and said adjacent top surface of said first S/D of said second pull-up FET;

a third trench in said trench isolation between and abutting said first and second regions and a first electrically conductive strap in said trench, said strap in direct physical and electrical contact with a sidewall of said first common S/D and in direct physical and electrical contact with said end wall of said first S/D of said first pull-up FET; and a fourth trench in said trench isolation between and abutting said third and fourth regions and a second electrically conductive strap in said fourth trench, said second strap in direct physical and electrical contact with said end wall of said second common S/D and in direct physical and electrical contact with a sidewall of said first S/D of said second pull-up FET.

12. The SRAM cell of claim 11, wherein top surfaces of said first and second straps are recessed below a top surface of said trench isolation and respective top surfaces of said first, second, third and fourth regions.

13. The SRAM cell of claim 11, further including:

a first notch in a top surface and a sidewall of said first common S/D and a second notch in a top surface and a sidewall of said first S/D of said first pull-up device, said first and second notches open to said first trench; and a third notch in a top surface and a sidewall of said second common S/D and a fourth notch in a top surface and a sidewall said first S/D of said second pull-up device, said third and fourth notches open to said second trench.

14. A method of forming static random access memory (SRAM) cell, comprising:

forming a first pass gate field effect transistor (FET) and a first pull-down FET sharing a first common source/drain (S/D) and a first pull-up FET having first and second S/Ds;

forming a second pass gate FET and a second pull-down FET sharing a second common S/D and a second pull-up FET having first and second S/Ds;

forming a first gate electrode common to said first pull-down FET and said first pull-up FET and physically and electrically contacting said first S/D of said second pull-up FET, said first S/D of said second pull-up FET having a first end adjacent to said first gate electrode and a opposite second end adjacent to a third gate electrode, said first gate electrode extending over and electrically and physically contacting an end wall of said first end of said first S/D of said second pull-up FET and extending over an adjacent top surface of said first end of said first S/D of said second pull-up FET;

forming a second gate electrode of said first pass gate FET;

forming said third gate electrode common to said second pull-down FET and said second pull-up FET and physically and electrically contacting said first S/D of said first pull-up FET, said first S/D of said first pull-up FET having a first end adjacent to said third gate electrode and a opposite second end adjacent to said first gate electrode, said third gate electrode extending over and electrically and physically contacting an end wall of said first end of said first S/D of said first pull-up FET and extending over an adjacent top surface of said first end of said first S/D of said first pull-up FET; and forming a fourth gate electrode of second pass gate FET.

15. The method of claim 14, wherein said first, second, third and fourth gate electrodes are unconnected regions of a same layer of a same material.

16. The method of claim 14, including:

forming metal silicide layers on respective top surfaces of said first, second, third and fourth gate electrodes, said first, second, third and fourth gate electrodes comprising polysilicon.

17. The method of claim 14, wherein:

first major axes of said first, second, third and fourth gate electrodes are parallel;

said first common S/D, a second S/D of said first pass gate FET and a second S/D of said first pull-down FET are located in a contiguous first region of a semiconductor substrate;

said first S/D and said second S/D of said first pull-up FET are located in a contiguous second region of said semiconductor substrate;

said first S/D and said second S/D of said second pull-up FET are located in a contiguous third region of said semiconductor substrate;

said second common S/D, a second S/D of said second pass gate FET and said second S/D of a second pull-down FET are located in a contiguous fourth region of said semiconductor substrate;

second major axes of said first, second, third and fourth regions are parallel; and said first and second major axes are perpendicular.

18. The method of claim 14, including:

forming trench isolation between first, second, third and fourth regions of a semiconductor substrate, said first common S/D in said first region, said first and second S/Ds of said first pull-up FET in said second region, said second common S/D in said third region, said first and second S/Ds of said second pull-up FET in said fourth region;

forming a first trench in said dielectric trench isolation abutting said end wall of said first end of first S/D of said first pull-up FET, said third gate electrode at least partially filling said first trench and physically and electrically contacting said end wall of said first end and said adjacent top surface of said first S/D of said first pull-up FET; and forming a second trench in said dielectric trench isolation abutting said end wall of said first end of first S/D of said second pull-up FET, said first gate electrode at least partially filling said second trench and physically and electrically contacting said end wall of said first end and said adjacent top surface of said first S/D of said second pull-up FET.

19. The method of claim 18, including:

forming a second S/D of said first pass gate FET in said first region and on an opposite side of said second gate electrode from said first common S/D;

forming a second S/D of said first pull-down FET in said first region and on an opposite side of said first gate electrode from said first common S/D;

forming said second S/D of said first pull-up FET in said second region and on an opposite side of said first gate electrode from said first S/D of said first pull-up FET;

forming a second S/D of said second pass gate FET in said third region and on an opposite side of said fourth gate electrode from said second common S/D;

forming a second S/D of said second pull-down FET in said third region and on an opposite side of said third gate electrode from said second common S/D; and forming said second S/D of said second pull-up FET in said fourth region and on an opposite side of said third gate electrode from said first S/D of said second pull-up FET.

20. The method of claim 14, including:
forming a first buried strap between said first common S/D and said first S/D of said first pull-up FET, said first buried strap in direct physical and electrical contact with a sidewall of said first common S/D and a sidewall of said of said first S/D of said first pull-up FET; and
forming a second buried strap between said second common S/D and said first S/D of said second pull-up FET, said second buried strap in direct physical and electrical contact with a sidewall of said second common S/D and a sidewall of said of said first S/D of said second pull-up FET.

21. The method of claim 20, wherein said first, second, third and fourth gate electrodes and said first and second straps are unconnected regions of a same layer of a same material.

22. The method of claim 20, including:
forming metal silicide layers on respective top surfaces of said first, second, third and fourth gate electrodes and said first and second straps, said first, second, third and fourth gate electrodes and said first and second straps comprising polysilicon.

23. The method of claim 20, wherein:
first major axes of said first, second, third and fourth gate electrodes and said first and second straps are parallel;
said first common S/D, said second S/D of said first pass gate FET and said S/D of said first pull-down FET are located in a contiguous first region of a semiconductor substrate;
said first S/D and said second S/D of said first pull-up FET are located in a contiguous second region of said semiconductor substrate;
said first S/D and said second S/D of said second pull-up FET are located in a contiguous third region of said semiconductor substrate;
said second common S/D, said second S/D of said second pass gate FET and said S/D of said second pull-down FET are located in a contiguous fourth region of said semiconductor substrate;
second major axes of said first, second, third and fourth regions are parallel; and
said first and second major axes are perpendicular.

24. The method of claim 14, including:
forming trench isolation between first, second, third and fourth regions of a semiconductor substrate, said first common S/D, a second S/D of said first pass gate FET and a second S/D of said first pull-down FET in said first region of said semiconductor substrate, said first S/D and said second S/D of said first pull-up FET in said second region of said semiconductor substrate, said first S/D and said second S/D of said second pull-up FET in said third region of said semiconductor substrate, and said second common S/D, a second S/D of said second pass gate FET and a second S/D of said second pull-down FET are located in said fourth region of said semiconductor substrate;
forming a first trench in said trench isolation abutting said sidewall of said first end of first S/D of said first pull-up FET, said third gate electrode at least partially filling said first trench and physically and electrically contacting said sidewall of said first end and said adjacent top surface of said first S/D of said first pull-up FET; and
forming a second trench in said trench isolation abutting said sidewall of said first end of first S/D of said second pull-up FET, said first gate electrode at least partially filling said second trench and physically and electrically contacting said sidewall of said first end and said adjacent top surface of said first S/D of said second pull-up FET;
forming a third trench in said trench isolation between and abutting said first and second regions and a first electrically conductive strap in said trench, said strap in direct physical and electrical contact with said end wall of said first common S/D and in direct physical and electrical contact with a sidewall of said first S/D of said first pull-up FET; and
forming a fourth trench in said trench isolation between and abutting said third and fourth regions and a second electrically conductive strap in said fourth trench, said second strap in direct physical and electrical contact with said end wall of said second common S/D and in direct physical and electrical contact with a sidewall of said first S/D of said second pull-up FET.

25. The method of claim 24, wherein top surfaces of said first and second straps are recessed below a top surface of said trench isolation and respective top surfaces of said first, second, third and fourth regions.

26. The method of claim 24, further including:
forming a first notch in a top surface and a sidewall of said first common S/D and forming a second notch in a top surface and a sidewall of said first S/D of said first pull-up device, said first and second notches open to said first trench; and
forming a third notch in a top surface and a sidewall of said second common S/D and a forming fourth notch in a top surface and a sidewall said first S/D of said second pull-up device, said third and fourth notches open to said second trench.

* * * * *